United States Patent [19]

Ogawa

[11] Patent Number: 4,568,848
[45] Date of Patent: Feb. 4, 1986

[54] ACOUSTIC SURFACE WAVE DEVICES CONTAINING PIEZOELECTRIC CERAMICS

[75] Inventor: Toshio Ogawa, Nagaokakyo, Japan

[73] Assignee: Murata Manufacturing Co, Ltd., Kyoto, Japan

[21] Appl. No.: 583,299

[22] Filed: Feb. 29, 1984

Related U.S. Application Data

[63] Continuation of Ser. No. 322,632, Nov. 18, 1981, abandoned, which is a continuation of Ser. No. 151,370, May 19, 1980, abandoned, which is a continuation of Ser. No. 969,273, Dec. 14, 1978, abandoned, which is a continuation-in-part of Ser. No. 871,107, Jan. 19, 1978, abandoned, which is a continuation-in-part of Ser. No. 744,776, Nov. 24, 1976, abandoned.

[30] Foreign Application Priority Data

Nov. 25, 1974 [JP] Japan ................. 49-141477

[51] Int. Cl.⁴ .............................................. C04B 35/49
[52] U.S. Cl. ................................ 310/313 B; 310/358; 252/62.9
[58] Field of Search .................... 252/62.9; 310/313 B, 310/358

[56] References Cited

U.S. PATENT DOCUMENTS

| | | | |
|---|---|---|---|
| 3,179,594 | 4/1965 | Kulcsar et al. | 252/62.9 |
| 3,461,071 | 8/1969 | Akashi | 252/62.9 |
| 3,518,199 | 6/1970 | Tsubouchi et al. | 252/62.9 |
| 3,669,887 | 6/1972 | Nishida et al. | 252/62.9 |
| 3,750,056 | 7/1973 | Subramanian | 310/313 A X |
| 3,804,765 | 4/1974 | Buckner et al. | 252/62.9 |
| 3,970,572 | 7/1976 | Ogawa et al. | 252/62.9 |

FOREIGN PATENT DOCUMENTS

| | | | |
|---|---|---|---|
| 2653406 | 5/1977 | Fed. Rep. of Germany | 252/62.9 |
| 51-31000 | 3/1976 | Japan | 252/62.9 |
| 51-42995 | 4/1976 | Japan | 252/62.9 |
| 51-42997 | 4/1976 | Japan | 252/62.9 |

Primary Examiner—Jack Cooper
Attorney, Agent, or Firm—Birch, Stewart, Kolasch & Birch

[57] ABSTRACT

A piezoelectric ceramic for acoustic surface wave devices which consists essentially of a solid solution of the ternary system $Pb(Sn_aSb_{1-a})O_3$-$PbTiO_3$-$PbZrO_3$ having a composition showing a phase transition between a ferroelectric rhombohedral low temperature phase ($F_{R(LT)}$) and a ferroelectric rohombohedral high temperature phase ($F_{R(HT)}$) at a temperature within the range from $-20°$ C. to $+80°$ C. The solid solution consists essentially of a main component expressed by the formula:

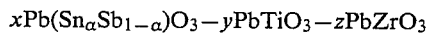

$$xPb(Sn_aSb_{1-a})O_3 - yPbTiO_3 - zPbZrO_3$$

where in $x+y+z=1.00$, $\frac{1}{4} \leq a \leq \frac{3}{4}$, and contains, as an additive, manganese in oxide form in an amount of 0.05 to 5.0 wt % when converted into $MnO_2$ and, if necessary, further contains at least one element selected, from magnesium and chromium in oxide form in respective amounts of 0.05 to 5.0 wt % when respectively converted into $MgO$ and $Cr_2O_3$.

14 Claims, 11 Drawing Figures

ACOUSTIC SURFACE WAVE DEVICES CONTAINING PIEZOELECTRIC CERAMICS

This is a continuation of application Ser. No. 322,632, filed on Nov. 18, 1981, which itself is a continuation of application Ser. No. 151,370, filed May 19, 1980, which is a continuation of Ser. No. 969,273, filed Dec. 14, 1978, which is a continuation-in-part application of Ser. No. 871,107, filed on Jan. 19, 1978, which is, in turn, a continuation-in-part application of Ser. No. 744,776, filed on Nov. 24, 1976, all now abandoned.

This invention relates to piezoelectric ceramics for acoustic surface wave devices, consisting essentially of a main component, $Pb(Sn_\alpha Sb_{1-\alpha})O_3$-$PbTiO_3$-$PbZrO_3$ ($\frac{1}{4} \leq \alpha \leq \frac{3}{4}$), and containing, as an additive or additives, manganese or manganese and at least one element of the group consisting of magnesium and chromium.

It has been known to use $LiNbO_3$ single crystals, or $LiTaO_3$ single crystals as piezoelectric materials for acoustic surface wave devices such as, for example, acoustic surface wave filters, acoustic surface wave delay lines, and acoustic surface wave discriminators. The single crystals of $LiNbO_3$ and $LiTaO_3$ have the advantage that they have no pore therein so that it is easy to provide surfaces of single crystal wafers with interdigital electrodes when producing acoustic surface wave devices. Since such single crystals have low permittivity, it is possible to produce acoustic surface wave devices having high impedance, thus making it possible to decrease the matching loss to external electric circuits. Further, such single crystals have relatively high electromechanical coupling coefficients ($K_{SAW}$) and make it possible to produce acoustic surface wave filters having low propagation loss. In addition, the use of single crystal $LiTaO_3$ also makes it possible to produce acoustic surface wave filters having favourable temperature characteristics since it has a very small temperature coefficient of center frequency of the order of 0 ppm/°C. in the temperature range from $-20°$ C. to $+80°$ C. when a center frequency at $+20°$ C. is employed as a criterion thereof, while the single crystal $LiNbO_3$ has a temperature coefficient of the order of $-70$ ppm/°C.

Although such single crystals have various advantages as mentioned above, there are serious disadvantages that they are expensive and involve great problems in construction. For example, it is very difficult to cut out single crystal wafers for acoustic surface wave filters having small values of the temperature coefficient of center frequency.

Recently, the lead zirconate titanate ceramics of the system $Pb(Ti, Zr)O_3$ have become of major interest as piezoelectric materials for acoustic surface wave devices since such piezoelectric ceramics can be mass produced cheaply by conventional techniques for ceramic manufactures.

Up to now, the lead zirconate titanate ceramics have been used as materials for piezoelectric ceramic devices such as ceramic filters, ceramic resonators and ultrasonic wave vibrators. The use of such piezoelectric ceramics makes it possible to produce ceramic filters or ceramic resonators having low temperature dependency of center or resonant frequency by the suitable selection of its composition. For example, when resonators with radial extensional mode vibration generally longitudinal waves or with thickness shear mode vibration generating side waves are produced by using a ceramics of composition $Pb(Ti_{0.55}Zr_{0.45})O_3$, the temperature coefficients of resonant frequency are $+33$ ppm/°C. and $+21$ ppm/°C., respectively, in the temperature range from $-20°$ C. to $+80°$ C. when the resonant frequency at $+20°$ C. is the criterion.

Although there are various acoustic surface wave devices as mentioned above, the description hereinafter will be taken in connection with an acoustic surface wave filter, for convenience sake.

As discussed by R. M. White in "Proceedings of The IEEE, 58(1970) 1238", an acoustic surface wave is a combined wave of a longitudinal wave and a side wave, so that it will be expected that the use of the above composition, i.e., $Pb(Ti_{0.55}Zr_{0.45})O_3$ makes it possible to produce acoustic surface wave filters having a favourable temperature characteristic of center frequency. In fact, when acoustic surface wave filters are made from this composition the temperature coefficient of center frequency thereof is $+29$ ppm/°C.

Phase diagram in the system $PbTiO_3$-$PbZrO_3$ shows that the system contains a tetragonal ferroelectric phase ($F_T$) and a ferroelectric rhombohedral phase ($F_R$) and that the ferroelectric rombohedral phase divides into two phases, i.e., a ferroelectric rhombohedral low temperature phase ($F_{R(LT)}$) and a ferroelectric rhombohedral high temperature phase ($F_{R(HT)}$), as shown in FIG. 1. For these compositions, a morphotropic phase boundary occurs at approximately $Pb(Ti_{0.48}Zr_{0.52})O_3$, so that the above composition $Pb(Ti_{0.55}Zr_{0.45})O_3$ is tetragonal ferroelectric.

Since ceramic filters are generally required to have small temperature dependency, piezoelectric ceramics having compositions on the tetragonal side of the phase boundary have widely been used, while the piezoelectric ceramics having the compositions on the rhombohedral side of the phase boundary have scarcely been used because of their large temperature dependence.

For example, when ceramic resonators with a radial extensional mode or thickness shear mode vibration are produced by using a rhombohedral composition $Pb(Ti_{0.40}Zr_{0.60})O_3$, there are obtained temperature characteristics of resonant frequency as shown in FIG. 2. In this figure, a broken line shows the temperature characteristic of resonant frequency for the resonator of radial extensional mode, and one dot line shows that for the resonator of thickness shear mode. The change rate of resonant frequency ($\Delta fr$) is calculated by the equation:

$$\Delta fr = \frac{fr - fr20}{fr20} \times 100(\%)$$

where
fr = Resonant frequency at a temperature in the range of $-20°$ C. to $+80°$ C.
fr20 = Resonant frequency at 20° C.

It will be understood from FIG. 2 that the resonant frequency of the resonators comprising the rhombohedral composition varies greatly with temperature, so that it is considered to be difficult to apply rhombohedral compositions of $Pb(Ti, Zr)O_3$ to acoustic surface wave devices.

Accordingly, for the production of acoustic surface wave filters with favourable temperature characteristics, it is preferred to use ceramics of tetragonal $Pb(Ti, Zr)O_3$ solid solution. However, when tetragonal compositions are applied to acoustic surface wave filters, serious disadvantages occur because of their high permittivity. In cases where interdigital electrodes are provided on the surface of ceramic wafers, a relation between the permittivity and impedance is given by the equation: $Z \alpha 1/(\epsilon_{33}\epsilon_{11})^{\frac{1}{2}}$. Thus, the greater the permittivity (i.e., $(\epsilon_{33}\epsilon_{11})^{\frac{1}{2}}$), the smaller the impedance, resulting in the increase of matching loss when the acoustic surface wave filter is connected to the external circuit. Because, in order to lessen the matching loss, it is very important to use an acoustic surface wave filter having the impedance nearly equal to the impedance of the external circuit which has generally an impedance of the order of 100 to 1000 ohms. In this connection, when a tetragonal ferroelectric composition, $Pb(Ti_{0.55}Zr_{0.45})O_3$ is used as a material for ceramic wafers, acoustic surface wave filters with an electrode pattern shown in FIG. 3 have a impedance of 86Ω and thus produce a large matching loss. In order to overcome such disadvantages, it has been proposed to reduce the electrostatic capacity of the filters by dividing the interdigital electrodes and connecting them in series. This gives acoustic surface wave filters with relatively high impedance, but it necessarily causes the increase of the whole size and cost of the device. Thus, this proposed solution is considered to be disadvantageous under the current circumstances where the miniaturization and integration of electric circuits are directed.

On the other side, the piezoelectric ceramics used for acoustic surface wave devices are required to have various electrical and physical properties, for example, as specified in IEEE transactions "CHARACTERISTICS OF SURFACE WAVE INTEGRATABLE FILTERS" by A. J. Devries et al, 1971, as follows:

1. to have an acoustic surface wave electromechanical coupling factor ($K_{SAW}$) not less than 15%;
2. to be stable and a reproduceable material having
   (a) a temperature coefficient ($Cf_{SAW}$) of the acoustic surface wave velocity (Delaying time) less than 25 ppm/°C.,
   (b) an aging characteristic of the acoustic surface wave velocity less than 0.5% per year, and
   (c) reproducibility of the acoustic surface wave velocity less than 1%;
3. to have surface smoothness not more than 10 μm;
4. to have permittivity ($\epsilon$) in the range of 10 to 1000; and
5. to be produced at a low cost.

In addition to the above, as mentioned below, they have preferably grain sizes not more than 5 μm and mechanical quality factor of radial extensional mode ($Qm_p$) not less than 1500 for the purpose of minimizing the propagation loss of acoustic surface waves.

It is an object of the present invention to provide a new and improved piezoelectric ceramics for acoustic surface wave devices by which the above requirements are fully satisfied.

According to the present invention, there is provided a piezoelectric ceramics for acoustic surface wave devices consisting essentially of a rhombohedral solid solution of the ternary system $Pb(Sn_\alpha Sb_{1-\alpha})O_3$-$PbTiO_3$-$PbZrO_3$ having a composition showing a phase transition between a ferroelectric rhombohedral low temperature phase ($F_{R(LT)}$) and a ferroelectric rhombohedral high temperature phase ($F_{R(HT)}$) at a temperature within the range from −20° C. to +80° C., said composition consisting essentially of a main component expressed by the formula:

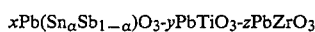

wherein $x+y+z=1.00$, $\frac{1}{4} \leq \alpha \leq \frac{3}{4}$, and containing, as an additive, manganese in oxide form in an amount of 0.05 to 5.0 wt% when converted into $MnO_2$ and, if necessary, further containing at least one element selected from the group consisting of magnesium and chromium ion oxide form in respective amounts of 0.05 to 5.0 wt% when respectively converted into $MgO$ and $Cr_2O_3$, said composition being in the compositional area defined by the points A, B, C, D, $E_1$, $F_1$ and G in FIG. 4, the sets of mol fractions of the three components at said points being as follows:

| | x | y | z |
|---|---|---|---|
| A | 0.01 | 0.44 | 0.55 |
| B | 0.01 | 0.04 | 0.95 |
| C | 0.01 | 0.01 | 0.95 |
| D | 0.15 | 0.01 | 0.84 |
| $E_1$ | 0.25 | 0.01 | 0.74 |
| $F_1$ | 0.25 | 0.25 | 0.50 |
| G | 0.15 | 0.35 | 0.50 |

If the value of $\alpha$ is less than $\frac{1}{2}$, several problems arise along with it. It is therefore preferred to limit the compositional area in response to the value of $\alpha$ as follows.

When $\frac{1}{3} \leq \alpha < \frac{1}{2}$, it is preferred to limit the compositional area to a polygonal area defined by the points A, B, C, D, $E_2$, $F_2$ and G in FIG. 4, the sets of mol fractions of the three components at said points being as follows:

| | x | y | z |
|---|---|---|---|
| A | 0.01 | 0.44 | 0.55 |
| B | 0.01 | 0.04 | 0.95 |
| C | 0.04 | 0.01 | 0.95 |
| D | 0.15 | 0.01 | 0.84 |
| $E_2$ | 0.20 | 0.01 | 0.79 |
| $F_2$ | 0.20 | 0.30 | 0.50 |
| G | 0.15 | 0.35 | 0.50 |

When $\frac{1}{4} \leq \alpha < \frac{1}{3}$, it is preferred to limit the compositional area to a polygonal area defined by the points A, B, C, D, $E_3$, $F_3$, and G in FIG. 4, the sets of mol fractions of the three components at said points being as follows:

| | x | y | z |
|---|---|---|---|
| A | 0.01 | 0.44 | 0.55 |
| B | 0.01 | 0.04 | 0.95 |
| C | 0.04 | 0.01 | 0.95 |
| D | 0.15 | 0.01 | 0.84 |
| $E_3$ | 0.15 | 0.10 | 0.75 |
| $F_3$ | 0.15 | 0.25 | 0.60 |
| G | 0.15 | 0.35 | 0.50 |

The invention will be further apparent from the following description with respect to examples and the accompanying drawings, in which.

EXAMPLES

Figure 1:
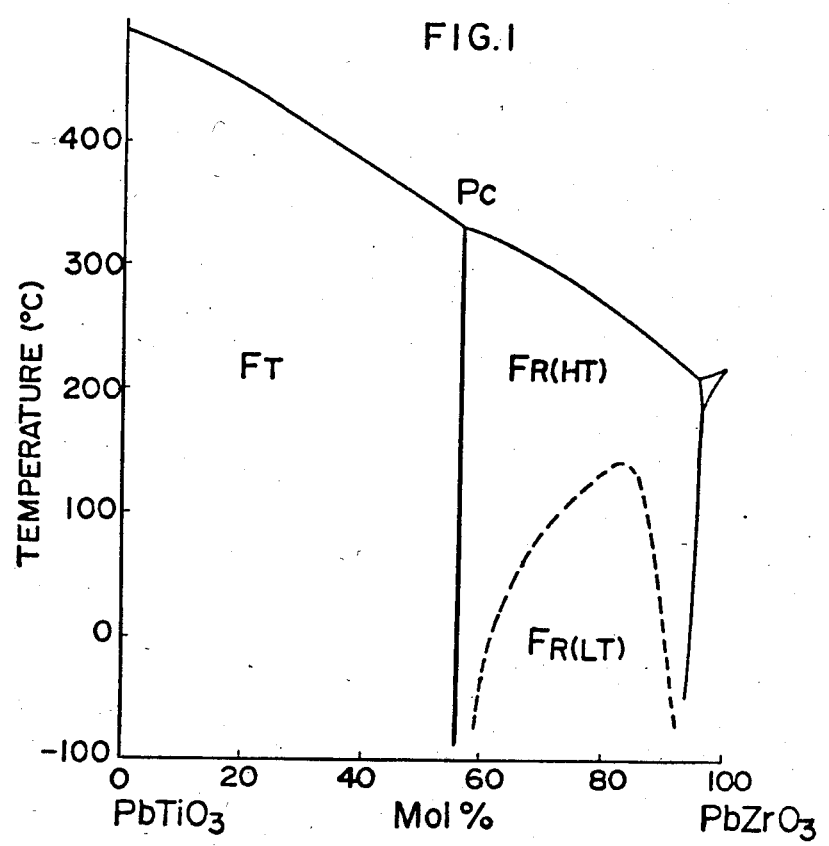
FIG. 1 is a phase diagram for the binary system $PbTiO_3$-$PbZrO_3$.
Figure 2:
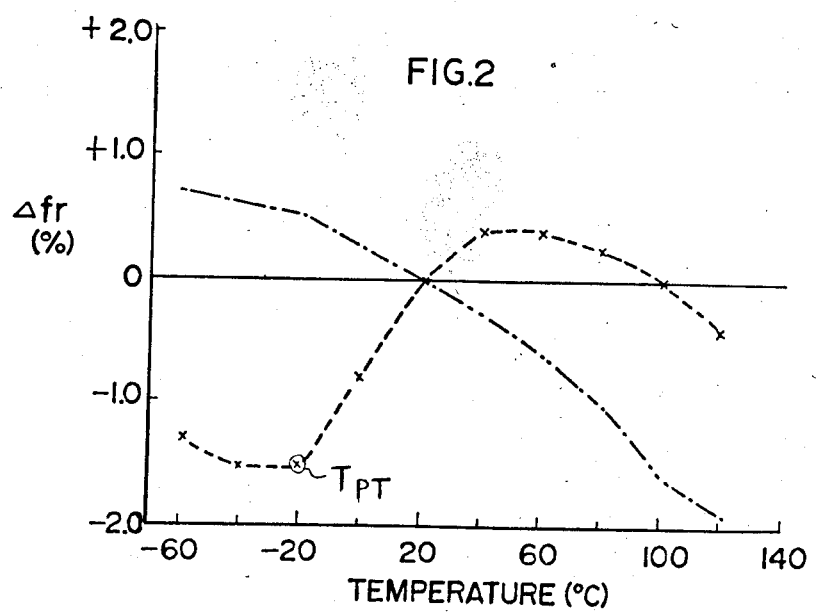
FIG. 2 is a graph showing the temperature characteristics of resonators with the radial extensional mode or thickness shear mode consisting of $Pb(Ti_{0.40}Zr_{0.60})O_3$.

Using as raw materials PbO, $TiO_2$, $ZrO_2$, $Sb_2O_3$, and $SnO_2$ for a main component, together with modifying elements $MnO_2$, MgO and $Cr_2O_3$, there were prepared mixture each having the compositional proportions shown in Table 1. As raw materials, there may be used those such as $Pb_3O_4$ and $MnCO_3$ which decompose on heating to PbO and $MnO_2$ respectively. The mixture of powdered raw materials was milled by the wet process for about 10 hours, then dried and calcined at 700° to 900° C. for 2 hours. The resultant presintered body was crushed, milled by the wet process together with a suitable amount of an organic binder for about 10 hours and then dried. The resultant powder was shaped into square wafers having a length of 50 mm and a thickness of 1.2 mm at a pressure of 750 to 1000 kg/cm², and then fired at a temperature of 1150° to 1300° C. for 2 hours in order to obtain piezoelectric ceramic wafers for acoustic surface wave filters. The grain size of the piezoelectric ceramic wafers is not more than 5 μm.

For the sake of more understanding of the present invention, piezoelectric ceramic disks having a diameter of 22 mm and a thickness of 1.2 mm were prepared in the same manner as mentioned above, and used for the preparation of resonators with the radial extensional mode or thickness shear mode.

In Tables 1 and 2, asterisks (*) indicate piezoelectric ceramics having compositions outside of the compositional area of the piezoelectric ceramics according to the present invention, and symbols T, R, O in the column of crystal phase mean a ferroelectric tetragonal phase, a ferroelectric rhombohedral phase and an antiferroelectric orthorhombic phase, respectively.

TABLE 1

| Specimen No. | α | Basic component (mol ratio) | | | Modifying element | Additive (weight present) | | | Crystal Phase |
| --- | --- | --- | --- | --- | --- | --- | --- | --- | --- |
| | | $Pb(Sn_\alpha Sn_{1-\alpha})O_3$ | $PbTiO_3$ | $PbZrO_3$ | | Mn | Mg | Cr | |
| 1* | 1/4 | 0.01 | 0.54 | 0.45 | Sr: 0.05 | 0.05 | 0.05 | 0.05 | T |
| 2* | 3/4 | 0.01 | 0.44 | 0.55 | — | — | — | — | R |
| 3* | 3/4 | 0.01 | 0.44 | 0.55 | — | 7.0 | — | — | R |
| 4 A | 1/4 | 0.01 | 0.44 | 0.55 | — | 0.05 | 0.05 | 0.05 | R |
| 5 A | 1/2 | 0.01 | 0.44 | 0.55 | — | 2.0 | — | 2.0 | R |
| 6 A | 3/4 | 0.01 | 0.44 | 0.55 | Ca: 0.10 | 5.0 | 5.0 | 5.0 | R |
| 7 | 1/3 | 0.01 | 0.40 | 0.59 | Sr: 0.15 | 1.0 | 3.0 | 1.0 | R |
| 8* | 1/4 | 0.01 | 0.04 | 0.95 | — | — | — | — | R |
| 9* | 1/4 | 0.01 | 0.04 | 0.95 | — | 0.01 | — | — | R |
| 10 B | 3/4 | 0.01 | 0.04 | 0.95 | — | 1.0 | — | 1.0 | R |
| 11* | 1/4 | 0.04 | 0.01 | 0.95 | — | 7.0 | 7.0 | — | R |
| 12 C | 1/4 | 0.04 | 0.01 | 0.95 | — | 2.0 | — | — | R |
| 13 C | 3/4 | 0.04 | 0.01 | 0.95 | — | 5.0 | 5.0 | 5.0 | R |
| 14* | 1/4 | 0.05 | 0.55 | 0.40 | — | 0.4 | — | — | T |
| 15 | 1/2 | 0.05 | 0.35 | 0.60 | — | 0.4 | — | — | R |
| 16 | 1/2 | 0.05 | 0.30 | 0.65 | — | 0.4 | — | — | R |
| 17 | 1/2 | 0.05 | 0.30 | 0.65 | — | 0.4 | — | 1.0 | R |
| 18* | 1/2 | 0.05 | 0.10 | 0.85 | — | 0.4 | — | — | R |
| 19* | 1/2 | 0.05 | 0.02 | 0.93 | — | 0.4 | — | — | R |
| 20 | 1/4 | 0.10 | 0.30 | 0.60 | Sr: 0.05 | 0.05 | 0.05 | 0.05 | R |
| 21* | 1/4 | 0.10 | 0.20 | 0.70 | — | — | — | — | R |
| 22 | 1/2 | 0.10 | 0.20 | 0.70 | Ba: 0.05 | 1.0 | — | — | R |
| 23 | 1/2 | 0.10 | 0.20 | 0.70 | — | 1.0 | 0.05 | — | R |
| 24 | 1/2 | 0.10 | 0.20 | 0.70 | — | 1.0 | 1.0 | — | R |
| 25* | 1/2 | 0.10 | 0.20 | 0.70 | Sr: 0.25 | 1.0 | 7.0 | — | R |
| 26 | 1/2 | 0.10 | 0.20 | 0.70 | — | 1.0 | 0.05 | 0.05 | R |
| 27 | 3/4 | 0.10 | 0.10 | 0.80 | — | 2.0 | — | — | R |
| 28 | 1/2 | 0.10 | 0.10 | 0.80 | — | 2.0 | — | 1.0 | R |
| 29* | 1/2 | 0.10 | 0.00 | 0.90 | — | 2.0 | — | — | O |
| 30 G | 1/4 | 0.15 | 0.35 | 0.50 | — | 5.0 | 0.3 | — | R |
| 31* | 3/4 | 0.15 | 0.35 | 0.50 | — | — | — | — | R |
| 32 G | 1/2 | 0.15 | 0.35 | 0.50 | — | 3.0 | 3.0 | 3.0 | R |
| 33 | 3/4 | 0.15 | 0.35 | 0.50 | Sr: 0.05 | 5.0 | — | 0.3 | R |
| 34 F₃ | 3/4 | 0.15 | 0.25 | 0.60 | — | 0.05 | 0.05 | 0.05 | R |
| 35 | 1/4 | 0.15 | 0.15 | 0.70 | Ca: 0.15 | 3.0 | — | — | R |
| 36 E₃ | 3/4 | 0.15 | 0.10 | 0.75 | Cd: 0.10 | 3.0 | — | 3.0 | R |
| 37 E₃ | 3/4 | 0.15 | 0.10 | 0.75 | — | 0.05 | 5.0 | 5.0 | R |
| 38* | 3/4 | 0.15 | 0.01 | 0.84 | — | — | — | — | R |
| 39 D | 3/4 | 0.15 | 0.01 | 0.84 | — | 3.0 | 3.0 | — | R |
| 40 F₂ | 1/4 | 0.20 | 0.30 | 0.50 | Ca: 0.10 | 2.0 | 1.5 | — | R |
| 41 F₂ | 9/20 | 0.20 | 0.30 | 0.50 | — | 5.0 | — | 5.0 | R |
| 42 | 1/2 | 0.20 | 0.30 | 0.50 | — | 0.05 | 1.0 | 1.0 | R |
| 43 | 9/20 | 0.20 | 0.20 | 0.60 | Sr: 0.15 | 2.0 | — | 2.0 | R |
| 44* | 1/4 | 0.20 | 0.10 | 0.70 | — | 7.0 | — | — | R |
| 45 | 9/20 | 0.20 | 0.10 | 0.70 | — | 0.05 | — | — | R |
| 46* | 3/4 | 0.20 | 0.10 | 0.70 | — | — | — | — | R |
| 47 | 3/4 | 0.20 | 0.10 | 0.70 | — | 1.0 | — | 1.0 | R |
| 48* | 3/4 | 0.20 | 0.10 | 0.70 | — | 7.0 | — | 7.0 | R |
| 49 E₁ | 9/20 | 0.20 | 0.01 | 0.79 | — | 3.0 | — | 0.05 | R |
| 50 E₂ | 1/2 | 0.20 | 0.01 | 0.79 | — | 3.0 | 0.3 | — | R |

TABLE 1-continued

| Specimen No. | α | Basic component (mol ratio) Pb(Sn$_\alpha$Sn$_{1-\alpha}$)O$_3$ | PbTiO$_3$ | PhZrO$_3$ | Modifying element | Additive (weight present) Mn | Mg | Cr | Crystal Phase |
|---|---|---|---|---|---|---|---|---|---|
| 51* | ⅔ | 0.25 | 0.25 | 0.50 | — | — | — | — | R |
| 52 F$_1$ | ⅔ | 0.25 | 0.25 | 0.50 | Ca: 0.05 | 5.0 | — | — | R |
| 53 F$_1$ | ⅔ | 0.25 | 0.25 | 0.50 | — | 5.0 | 0.05 | — | R |
| 54 | ⅓ | 0.25 | 0.15 | 0.60 | — | 4.0 | — | 2.0 | R |
| 55* | ⅔ | 0.25 | 0.01 | 0.74 | — | — | — | — | R |
| 56 E$_1$ | ⅔ | 0.25 | 0.01 | 0.74 | — | 0.05 | 0.01 | — | R |
| 57 E$_1$ | ⅓ | 0.25 | 0.01 | 0.74 | — | 0.05 | 0.05 | 0.01 | R |
| 58* | ⅔ | 0.30 | 0.10 | 0.60 | — | 0.05 | — | 0.05 | R |

Using the piezoelectric ceramic wafers, there were prepared acoustic surface wave filters in the following manner.

Figure 3:
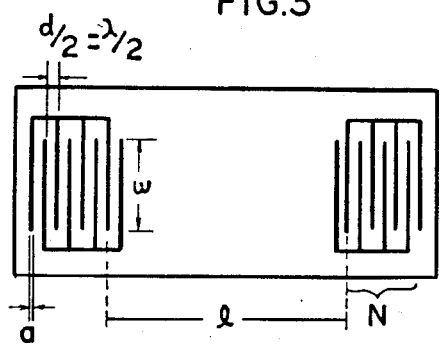
FIGS. 3 and 5 are schematic views of an acoustic surface wave filter.

Each piezoelectric ceramic wafer was polished its one surface to an extent that the roughness of the surface is not more than 1 μm. Both surfaces of the wafer were provided with electrodes by evaporating gold. The wafer was polarized in an insulating oil maintained at a temperature of 20° C. to 200° C., by applying a DC electric field of 3.0 to 4.0 kv/mm. After the poling treatment, the polished wafer was etched to form interdigital transducer (T) shown in FIG. 3. The dimensions of the transducer are as follows:
w=1.5 mm, a=53 μm
d/2=λ/2=106 μm, l=10 mm
N (a number of pairs of fingers)=20

The thus prepared acoustic surface wave filter was subjected to the measurements of the acoustic surface wave electromechanical coupling factor (K$_{SAW}$), the temperature coefficient of center frequency (C$_{fo.SAW}$), (ε$_{33}$ε$_{11}$)$^{\frac{1}{2}}$, phase transition temperature (T$_{PT}$) and propagation loss (L). The impedance (Z) of the filter was calculated from capacitance thereof.

Using the piezoelectric ceramic disks, there were prepared resonators with the radial extensional mode or thickness shear mode in the following manner.

1. Preparation of resonators with the radial extensional mode:

The piezoelectric ceramic disk was provided with a silver electrode on each surface thereof by baking and then polarized in an insulating oil maintained at a temperature of 20° C. to 200° C., by applying a DC electric field of 3.0-4.0 kv/mm between the electrodes.

The thus prepared resonator was subjected to the measurements of the permittivity (ε$_{33}$), electromechanical coupling factor (K$_p$), mechanical quality factor (Q$_{mp}$) and temperature coefficient of resonant frequency (C$_{fr.p}$).

2. Preparation of resonators with thickness shear mode:

The piezoelectric ceramic disk was lapped to a thickness of 200 to 300 μm, provided with a silver electrode on each end thereof by baking, and polarized in an insulating oil maintained at a temperature of 20° C. to 200° C., by applying a DC electric field of 3.0-4.0 kv/mm between the electrodes. After removal of the silver electrodes, the disk was provided with electrodes on both surfaces thereof by evaporating silver and then etched to form opposed circular electrodes having a diameter of 1-2 mm.

The thus prepared resonator with thickness shear mode was also subjected the measurements of piezoelectric properties such as the permittivity (ε$_{11}$), electromechanical coupling factor (K$_{15}$), mechanical quality factor (Qm$_{15}$), and temperature coefficient of resonant frequency (C$_{fr.15}$).

The acoustic surface wave electromechanical coupling factor (K$_{saw}$) is given by the following equation:

$$(V_2 - V_1)/V_1 = 1 - \sqrt{1 + (K_{SAW})^2} \cong -\frac{1}{2}(K_{SAW})^2$$

where
V$_1$=acoustic surface wave velocity in the case of that no metal layer is provided on the propagation path.
V$_2$=acoustic surface wave velocity in the case of that a conductive metal layer is provided on the propagation path.

The measurements of the permittivity (ε$_{33}$), (ε$_{11}$) were made with a capacitance bridge, and the electromechanical coupling factors (Kp), (K$_{15}$) and mechanical quality factors (Qmp), (Qm$_{15}$) were measured with the IRE standard circuits.

The temperature coefficient of center frequency or resonant frequency is given by the following equation:

Temperature coefficient (C$_{fo.SAW}$, C$_{fr.p}$, C$_{fr.15}$) =

$$\frac{f_{max} - f_{min}}{f_{20}} \times \frac{1}{100} \text{ (ppm/°C.)}$$

where
f$_{20}$=center (or resonant) frequency at 20° C.
f$_{max}$=maximum value of center (or resonant) frequency at a temperature within the range of −20° C. to +80° C.
f$_{min}$=minimum value of center (or resonant) frequency at a temperature within the range of −20° C. to +80° C.

The propagation loss on acoustic surface wave filters is measured in the following manner.

Figure 5:
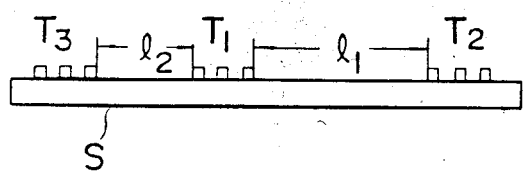

Using the above piezoelectric ceramic wafers, acoustic surface wave filters having a center frequency of 10 MHz were prepared as shown in FIG. 5 by providing interdigital transducers T$_1$, T$_2$, and T$_3$ on the surface of wafer substrate S, the interdigital transducer T$_1$ (i.e., l$_1 \neq$ l$_2$). The electrodes have the same dimension that in FIG. 3.

The propagation loss (L) was calculated by the following equation:

$$L = \frac{L_1 - L_2}{l_1 - l_2} \text{ (dB/cm)}$$

where L$_1$ and L$_2$ are the propagation losses produced during the propagation of acoustic surface waves from the transducing electrode T$_1$ to the transducing electrodes T$_2$ and T$_3$, respectively.

TABLE 2

| Specimen No. | Resonator with radial extensional mode | | | | Resonator with thickness shear mode | | | | Acoustic surface wave filter | | | | Transition temp (°C.) | Propagation Loss (dB/cm) |
|---|---|---|---|---|---|---|---|---|---|---|---|---|---|---|
| | $\epsilon_{33}$ (1KHz) | Kp (%) | $Q_{mp}$ | $C_{fr.p}$ (ppm/°C.) | $\epsilon_{11}$ (1KHz) | $K_{15}$ (%) | $Q_{m15}$ | $C_{fr.15}$ (ppm/°C.) | $K_{SAW}$ (%) | $C_{f0.SAW}$ (ppm/°C.) | $(\epsilon_{33}\epsilon_{11})^{\frac{1}{2}}$ | Z (Ω) | | |
| 1* | 744 | 42 | 1645 | +20 | 989 | 45 | 540 | +15 | 15.4 | +18 | 858 | 76 | — | 2.8 |
| 2* | 585 | 38 | 88 | +100 | 790 | 60 | 51 | −100 | 16.6 | −42 | 680 | 96 | −20 | 25 |
| 3* | 440 | 15 | 322 | +141 | 563 | 35 | 285 | −200 | 13.5 | −45 | 498 | 131 | −20 | 16.4 |
| 4*A | 414 | 33 | 2153 | +110 | 798 | 55 | 790 | −162 | 16.6 | −35 | 575 | 106 | −20 | 1.9 |
| 5 A | 473 | 36 | 1885 | +104 | 706 | 57 | 700 | −153 | 17.1 | −32 | 578 | 107 | −20 | 2.1 |
| 6 A | 500 | 28 | 1420 | +98 | 714 | 52 | 612 | −120 | 15.0 | −29 | 597 | 101 | −15 | 2.5 |
| 7 | 487 | 30 | 1519 | +87 | 707 | 55 | 623 | −110 | 15.2 | −25 | 587 | 105 | 0 | 1.7 |
| 8* | 233 | 4 | 115 | +72 | 315 | 12 | 77 | −103 | 6.5 | −42 | 271 | 252 | −10 | 23 |
| 9* | 235 | 4 | 107 | +69 | 311 | 14 | 81 | −108 | 5.8 | −43 | 270 | 253 | −10 | 23 |
| 10 B | 218 | 5 | 1711 | +65 | 342 | 15 | 694 | −100 | 7.6 | −40 | 274 | 250 | −5 | 2.4 |
| 11* | 215 | — | — | — | — | — | — | — | — | — | — | — | — | — |
| 12 C | 187 | 7 | 1976 | +77 | 275 | 17 | 723 | −133 | 10.2 | −42 | 226 | 300 | −10 | 2.0 |
| 13 C | 201 | 8 | 2243 | +70 | 330 | 25 | 777 | −130 | 14.5 | −38 | 258 | 283 | −15 | 1.8 |
| 14* | 677 | 30 | 1956 | −29 | 892 | 36 | 644 | −37 | 13.6 | −27 | 777 | 80 | — | 0.8 |
| 15 | 363 | 30 | 2625 | +160 | 670 | 51 | 514 | −138 | 16.2 | +38 | 493 | 130 | −20 | 0.7 |
| 16 | 329 | 22 | 3249 | +161 | 584 | 46 | 747 | −59 | 16.0 | +25 | 483 | 153 | 40 | 0.8 |
| 17 | 311 | 24 | 2890 | +186 | 597 | 47 | 703 | −66 | 16.1 | −30 | 431 | 155 | 40 | 0.9 |
| 18* | 246 | 13 | 4797 | −245 | 373 | 38 | 1157 | −81 | 15.3 | −93 | 302 | 220 | 90 | 1.0 |
| 19* | 193 | 0 | 0 | — | — | — | — | — | — | — | — | — | — | — |
| 20 | 388 | 28 | 3544 | +185 | 480 | 55 | 890 | −132 | 16.2 | +20 | 432 | 150 | 0 | 1.5 |
| 21* | 356 | 22 | 101 | +100 | 465 | 48 | 72 | −60 | 13.9 | +30 | 407 | 159 | −5 | 23 |
| 22 | 303 | 22 | 5576 | +105 | 470 | 48 | 1062 | −63 | 15.8 | +30 | 377 | 172 | −5 | 1.4 |
| 23 | 307 | 23 | 5842 | +95 | 473 | 50 | 1074 | −58 | 15.9 | +20 | 381 | 170 | −5 | 1.0 |
| 24 | 315 | 25 | 6018 | +80 | 477 | 52 | 1080 | −42 | 16.0 | +10 | 388 | 166 | −5 | 0.9 |
| 25* | 819 | 27 | 3240 | +133 | 1011 | 50 | 880 | −152 | 15.0 | −96 | 910 | 72 | −40 | 1.7 |
| 26 | 290 | 23 | 5607 | +102 | 465 | 49 | 1101 | −60 | 16.0 | +25 | 367 | 176 | −5 | 1.4 |
| 27 | 247 | 12 | 3157 | +92 | 304 | 45 | 900 | −55 | 15.3 | +31 | 274 | 236 | −10 | 1.5 |
| 28 | 256 | 13 | 3072 | +97 | 317 | 46 | 894 | −53 | 15.4 | +34 | 285 | 222 | −15 | 1.5 |
| 29* | 245 | — | — | — | — | — | — | — | — | — | — | — | — | — |
| 30 G | 460 | 35 | 2348 | +175 | 572 | 58 | 800 | −120 | 16.9 | −25 | 513 | 126 | 0 | 2.0 |
| 31* | 813 | 37 | 95 | +153 | 1000 | 60 | 62 | −115 | 16.4 | −30 | 902 | 72 | 5 | 23 |
| 32 G | 777 | 38 | 2177 | +142 | 992 | 61 | 754 | −101 | 18.4 | −34 | 878 | 74 | 5 | 1.9 |
| 33 | 445 | 36 | 2496 | +200 | 560 | 59 | 815 | −150 | 17.1 | −35 | 500 | 130 | 0 | 1.7 |
| 34 F$_3$ | 482 | 26 | 3611 | +134 | 710 | 49 | 905 | −115 | 16.1 | +28 | 585 | 112 | 50 | 1.5 |
| 35 | 400 | 20 | 4532 | +137 | 535 | 39 | 954 | −128 | 15.5 | −30 | 463 | 140 | 80 | 1.0 |
| 36 E$_3$ | 325 | 10 | 3988 | +150 | 470 | 30 | 902 | −144 | 15.0 | −37 | 391 | 166 | 75 | 1.5 |
| 37 E$_3$ | 304 | 12 | 2462 | +128 | 455 | 35 | 793 | −100 | 15.3 | −26 | 372 | 174 | 60 | 1.8 |
| 38* | 300 | 7 | 133 | +70 | 465 | 20 | 80 | −95 | 9.5 | −40 | 374 | 173 | 30 | 24 |
| 39 D | 295 | 8 | 1623 | +52 | 450 | 26 | 650 | −82 | 14.5 | −23 | 364 | 178 | 35 | 2.6 |
| 40 | 500 | 30 | 2015 | +150 | 711 | 51 | 801 | −123 | 16.2 | +21 | 596 | 103 | −5 | 1.2 |
| 41 F$_2$ | 502 | 33 | 2363 | +170 | 710 | 57 | 814 | −140 | 16.8 | +25 | 597 | 101 | 0 | 1.8 |
| 42 | 500 | 35 | 2019 | +123 | 698 | 58 | 786 | −94 | 17.0 | +15 | 591 | 105 | 0 | 1.9 |
| 43 | 485 | 24 | 3707 | +147 | 712 | 50 | 900 | −157 | 16.0 | −40 | 588 | 107 | 70 | 1.5 |
| 44* | 391 | 4 | 100 | +122 | 493 | 18 | 83 | −114 | 8.0 | −35 | 439 | 150 | 80 | 20.1 |
| 45 | 370 | 9 | 4601 | +134 | 475 | 28 | 972 | −110 | 14.8 | −28 | 419 | 155 | 70 | 1.4 |
| 46* | 416 | 8 | 97 | +126 | 520 | 26 | 54 | −95 | 12.4 | −25 | 465 | 140 | 65 | 23 |
| 47 | 362 | 10 | 5239 | +142 | 460 | 31 | 1083 | −125 | 15.2 | −32 | 408 | 160 | 75 | 1.4 |
| 48* | 344 | — | — | — | — | — | — | — | — | — | — | — | — | — |
| 49 E$_1$ | 380 | 7 | 1083 | +75 | 477 | 18 | 715 | −101 | 10.2 | −35 | 425 | 153 | −20 | 2.4 |
| 50 E$_2$ | 371 | 7 | 1755 | +52 | 471 | 18 | 701 | −96 | 10.2 | −23 | 418 | 156 | −20 | 2.3 |
| 51* | 601 | 22 | 85 | +132 | 804 | 43 | 55 | −158 | 13.8 | −39 | 695 | 94 | −25 | 27 |
| 52 F$_1$ | 500 | 21 | 2135 | +141 | 710 | 41 | 790 | −162 | 13.0 | −42 | 596 | 110 | −15 | 1.8 |
| 53 F$_1$ | 489 | 21 | 2416 | +114 | 700 | 41 | 797 | −129 | 12.8 | −30 | 624 | 105 | −10 | 1.6 |
| 54 | 452 | 18 | 1945 | +98 | 684 | 37 | 713 | −111 | 14.9 | −41 | 556 | 118 | −20 | 1.5 |
| 55* | 534 | 5 | 99 | +132 | 742 | 17 | 49 | −160 | 7.0 | −40 | 629 | 104 | −15 | 24 |
| 56 E$_1$ | 496 | 6 | 2059 | +135 | 708 | 18 | 780 | −162 | 9.7 | −41 | 593 | 110 | −15 | 2.0 |
| 57 E$_1$ | 477 | 6 | 2437 | +100 | 688 | 18 | 600 | −144 | 9.8 | −29 | 573 | 114 | −15 | 1.7 |
| 58* | — | — | — | — | — | — | — | — | — | — | — | — | — | 13 |

Results obtained are shown in Table 2.

As can be seen from Table 2, the resonators having the radial extensional mode or thickness shear mode and consisting of plain or modified ceramics of the ferroelectric rhombohedral solid solutions are inferior to the resonators consisting of ferroelectric tetragonal ceramics in the temperature coefficient of resonant frequency. However, in the case of that the ceramics of ferroelectric rhombohedral solid solution are adapted to acoustic surface wave filters, it is possible to produce acoustic surface wave filters having good temperature characteristics since the temperature coefficients of resonant frequency for the radial extensional and thickness shear modes are synthesized so as to compensate each other.

Figure 6:
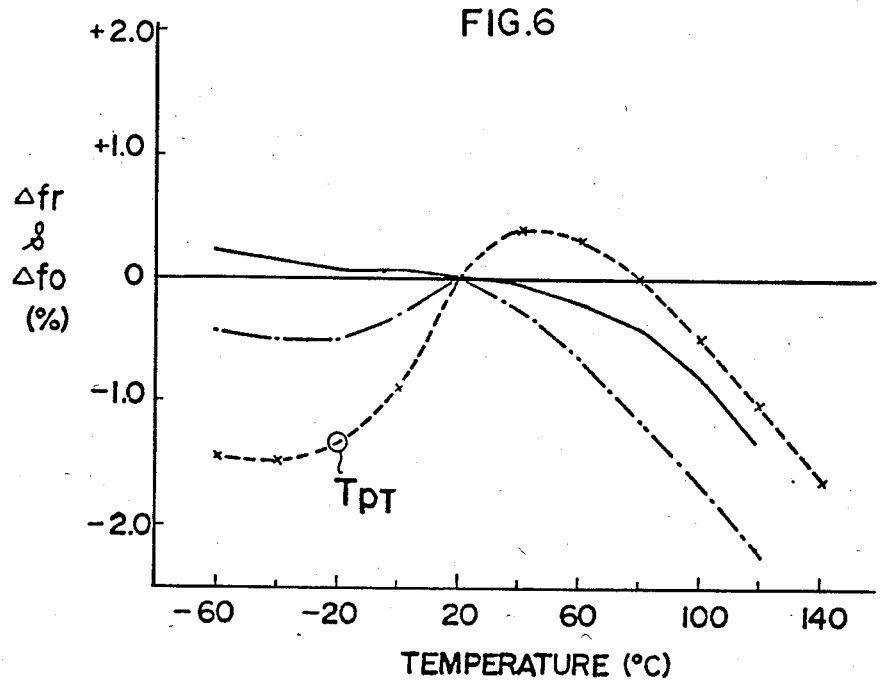
FIGS. 6 and 7 are graphs showing temperature characteristics of center and resonant frequencies, respectively.
Figure 7:
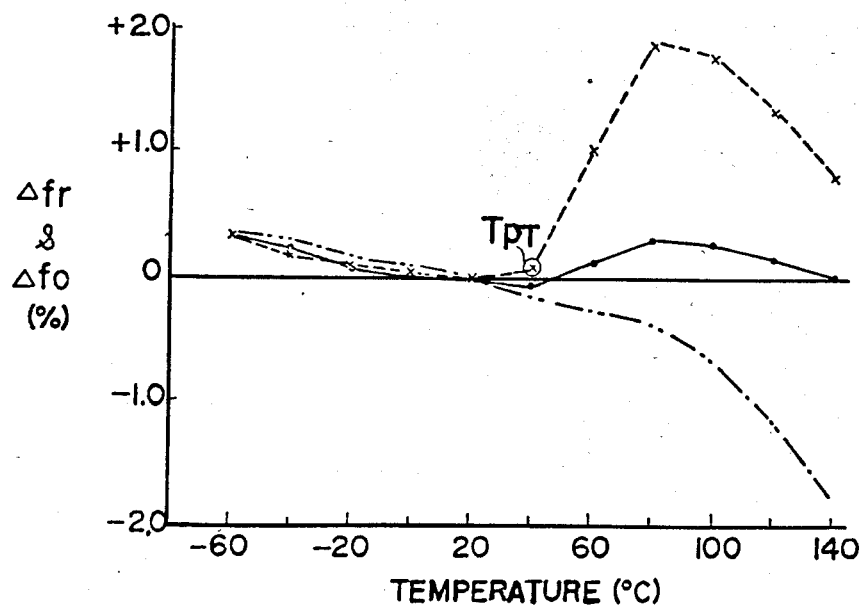

This is also supported by the experimental data for the acoustic surface wave filters in Table 2. For example, specimens Nos. 15 and 16 have good temperature characteristics as shown in FIGS. 6 and 7, respectively, in which solid lines show temperature characteristics of center frequency for acoustic surface wave filters, broken lines show temperature characteristics of resonant frequency for resonators having radial extensional mode vibration, and one dot lines show temperature characteristics of resonant frequency for resonators having thickness shear mode.

Figure 8:
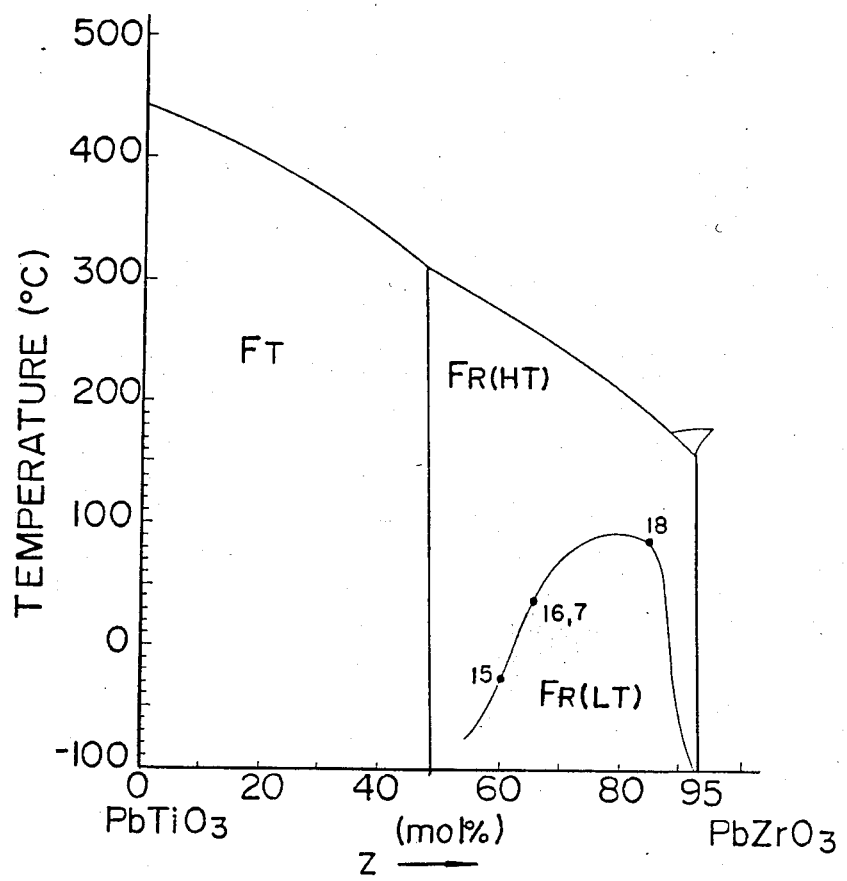
FIGS. 8 and 9 are phase diagram for the compositions of the present invention.

However, all the piezoelectric ceramics having compositions in the ferroelectric rhombohedral phase do not necessarily possess good temperature characteristics of center frequency. In order to produce acoustic surface wave filters having good temperature characteristics, it is necessary to use the ceramics having a phase transition temperature within the range of $-20°$ C. to $+80°$ C., at which the phase transition from the stable low temperature phase to the stable high temperature phase occurs in the ferroelectric rhombohedral phase. For example, in the system $0.05\ Pb(Sn_{\frac{1}{2}}Sb_{\frac{1}{2}})O_3$-$yPbTiO_3$-$zPbZrO_3 + 0.4$ wt% $MnO_2$, of which a phase diagram is shown in FIG. 8, the ceramics which can be used as materials for acoustic surface wave filters have composition containing the z-component in an amount approximately ranging from 60 to 72 mol% or from 86 to 90 mol%. Further, in the system $0.15Pb(Sn_{\frac{1}{2}}Sb_{\frac{1}{2}})O_3$-$yPbTiO_3$-$zPbZrO_3 + 5.0$ wt% $MnO_2 + 0.3$ wt% $MgO + 0.3$ wt% $Cr_2O_3$, of which a phase diagram is shown in FIG. 9, the ceramics which can be used have composition containing the z-component of the main components in an amount ranging from 50 to 75 mol%.

Figure 9:
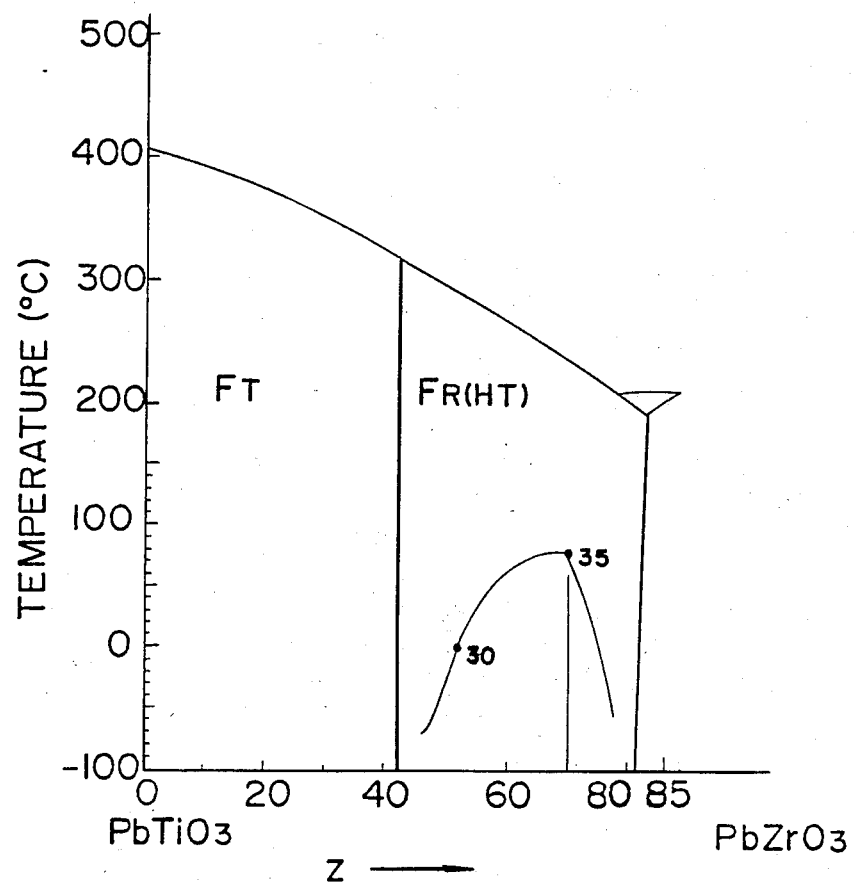

As can be seen from FIGS. 1, 8 and 9, the addition of x-component and the increase of the amount thereof may shift the phase transition between the low temperature phase ($F_{R(LT)}$) and the high temperature phase ($F_{R(HT)}$) to the lower temperature side, and may shift the morphotropic phase boundary to the lower content of z-component.

Figure 10:
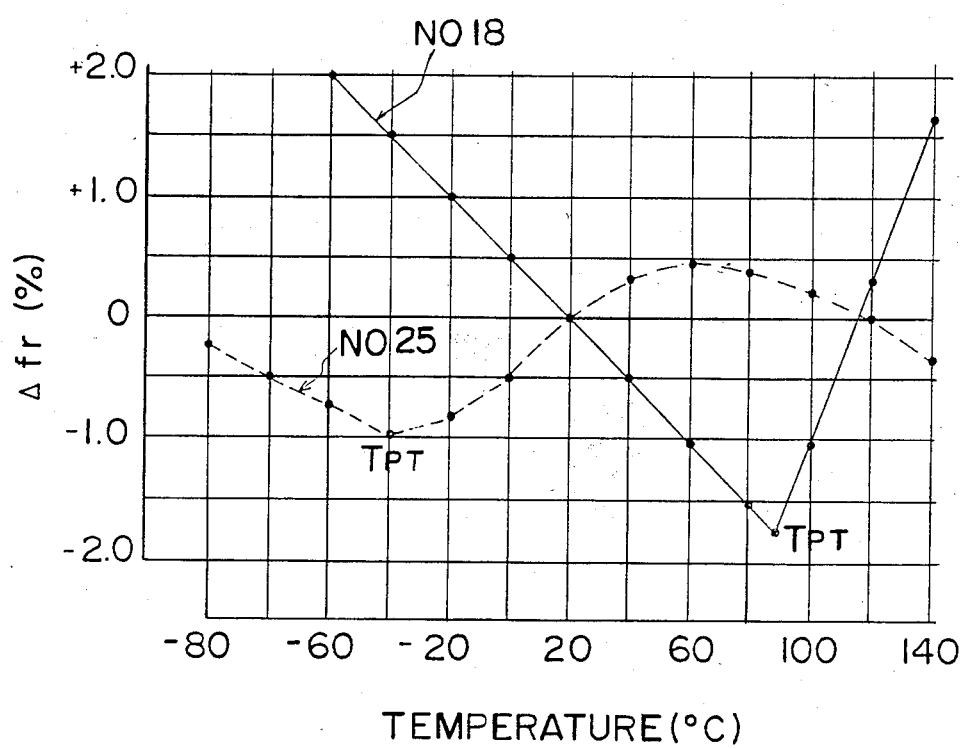
FIG. 10 is a graph showing a temperature characteristic of resonant frequency of the radial shear mode resonator; and, FIG. 11 is a graph showing a variation of electromechanical coupling factor ($K_{SAW}$) on acoustic surface wave filters as a function of composition for the composition of the present invention.

If the phase transition temperature is present outside of the above temperature range, it is difficult to produce acoustic surface wave filters having good temperature coefficient of center frequency. For example, radial extensional mode resonators are prepared by using ceramics of specimens Nos. 18 and 25, they possess the temperature characteristics of resonant frequency as shown in FIG. 10. In this figure, solid line shows the temperature characteristic for the resonator of specimen No. 18 and, the broken line shows that for the resonator of specimen No. 25. As can be seen from the figure, the ceramics of specimens Nos. 18 and 25 have a phase transition temperature lower than $-20°$ C. or higher than $+80°$ C. When these ceramics are adapted to surface wave filters, the temperature coefficient of center frequency of the filters are $-83$ ppm/°C. and $-85$ ppm/°C., respectively, which are greater than the permitted value of $\pm 70$ ppm/°C.

As mentioned above, acoustic surface wave filters are required to have high impedance to minimize the matching loss to the external circuits. From the values of impedance and $(\epsilon_{33}\epsilon_{11})^{\frac{1}{2}}$ shown in Table 2, it will be seen that the ceramics of ferroelectric rhombohedral composition are superior to the ceramics of ferroelectric tetragonal composition in the lowering of matching loss since the former has high impedance greater than that of the latter by 150 to 300%.

Although the acoustic surface wave filters are required to have a $K_{SAW}$ value more than 15 l, the $K_{SAW}$ value more than 5% suffices for the practical use. For example, the electromechanical coupling factor $(K_{SAW})O_3$ of the various surface wave filters are summarized in Table 3. The values of $K_{SAW}$ were calculated by $$v/v = 1 - \sqrt{1 + K_{SAW}^2} \cong -\frac{1}{2} K_{SAW}^2$$

The value of $\Delta v/v$ for each piezoelectric was taken from W. R. Smith et al, IEEE transactions "Designs of Surface wave Delay Lines with interdigital transducers" 1969.

TABLE 3

| Piezoelectric | $\Delta v/v$ (%) | $K_{SAW}$ (%) |
|---|---|---|
| $LiNbO_3$ | 2.46 | 22.18 |
| $Bi_{12}GeO_{20}$ | 1.15 | 15.17 |
| ZnO | 0.56 | 10.58 |
| Quartz | 0.11 | 4.69 |
| P Z T | 2.15 | 20.74 |
| CdS | 0.31 | 7.87 |
| $LiTaO_3$ | 0.82 | 12.81 |

The electromechanical coupling factor $K_{SAW}$ of the quartz is 69% as shown in Table 3, from which it will be seen that piezoelectrics other than quartz may be employed as materials for surface wave devices such as acoustic surface wave filters, delay lines, discriminators and the like when they have $K_{SAW}$ more than 5%. As can be seen from Table 2, the ceramics of the present invention enables to produce acoustic surface wave filters with $K_{SAW}$ more than 5%.

Figure 11:
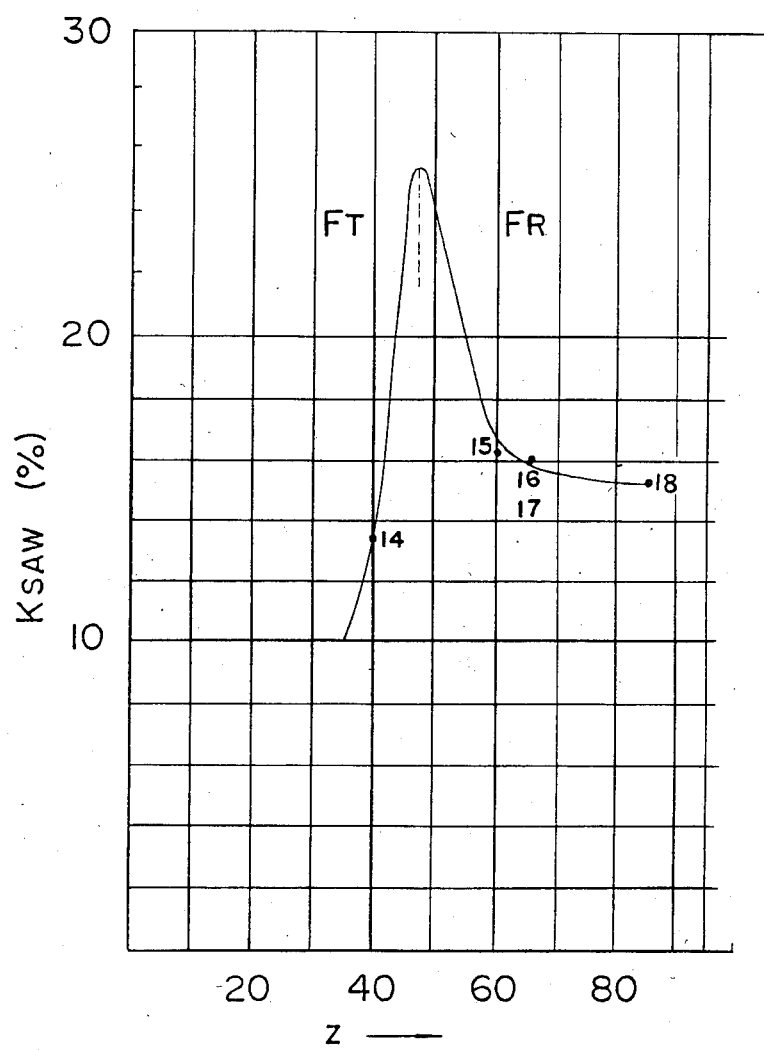

FIG. 11 shows the variation of $K_{SAW}$ with composition $0.05Pb(Sn_{\frac{1}{2}}Sb_{\frac{1}{2}})O_3$-$yPbTiO_3$-$zPbZrO_3 + 0.4$ wt% $MnO_2$ ceramics. From this figure, it will be seen that the ferroelectric rhombohedral ceramics have approximately constant values of $K_{SAW}$, regardless of the change of the composition, while the $K_{SAW}$ of the ceramics having a composition in the tetragonal phase varies greatly with the change of the composition.

It has been confirmed that the variation of the velocity of acoustic wave with the shape of the composition is small in the ferroelectric rhombohedral shape, as compared with that in the ferroelectric tetragonal phase.

Further, the propagation loss of surface waves for the ceramics of the present invention is small and 3 dB/cm or less, as shown in Table 2. Thus, it will be seen that the ceramics of the present invention enables to transmit surface waves effectively.

The incorporation of Mg and/or Cr into the ceramics containing Mn contributes to improve the stability and the homogeneity of the ceramics. This is supported by the following heat aging tests.

Using surface wave filters prepared in the above examples, the electromechanical coupling factor $K_{SAW}$ thereof were determined before and after forced heat aging. The forced heat aging was carried out by keeping the filters for 1 hour in a drier maintained at 150° C. The results are shown in Table 4. From this table, it can be seen that the ceramics containing Mn and at least one element of the group consisting of Mg and Cr enable to produce acoustic surface wave filters with excellent heat aging stability. Accordingly, the filters prepared by the ceramics of the present invention can be used under severe conditions.

From the comparison of data shown in Table 2 for specimen No. 22 with those for specimen Nos. 23 and 24, it will be seen that the incorporation of Mg into ceramics containing Mn enables to minimize the temperature coefficient of center frequency.

The reasons why the piezoelectric ceramics of the present invention have been limitted to rhombohedral compositions consisting essentially of a main component expressed by the formula: $xPb(Sn_\alpha Sb_{1-\alpha})O_3$-$yPbTiO_3$-$zPbZrO_3$ (wherein $x+y+z=1.00$, $\frac{1}{4} \leq \alpha \leq \frac{3}{4}$), and containing, as an additive or additives, Mn together with or without Mg and/or Cr are described below, making reference to FIG. 4.

Figure 4:
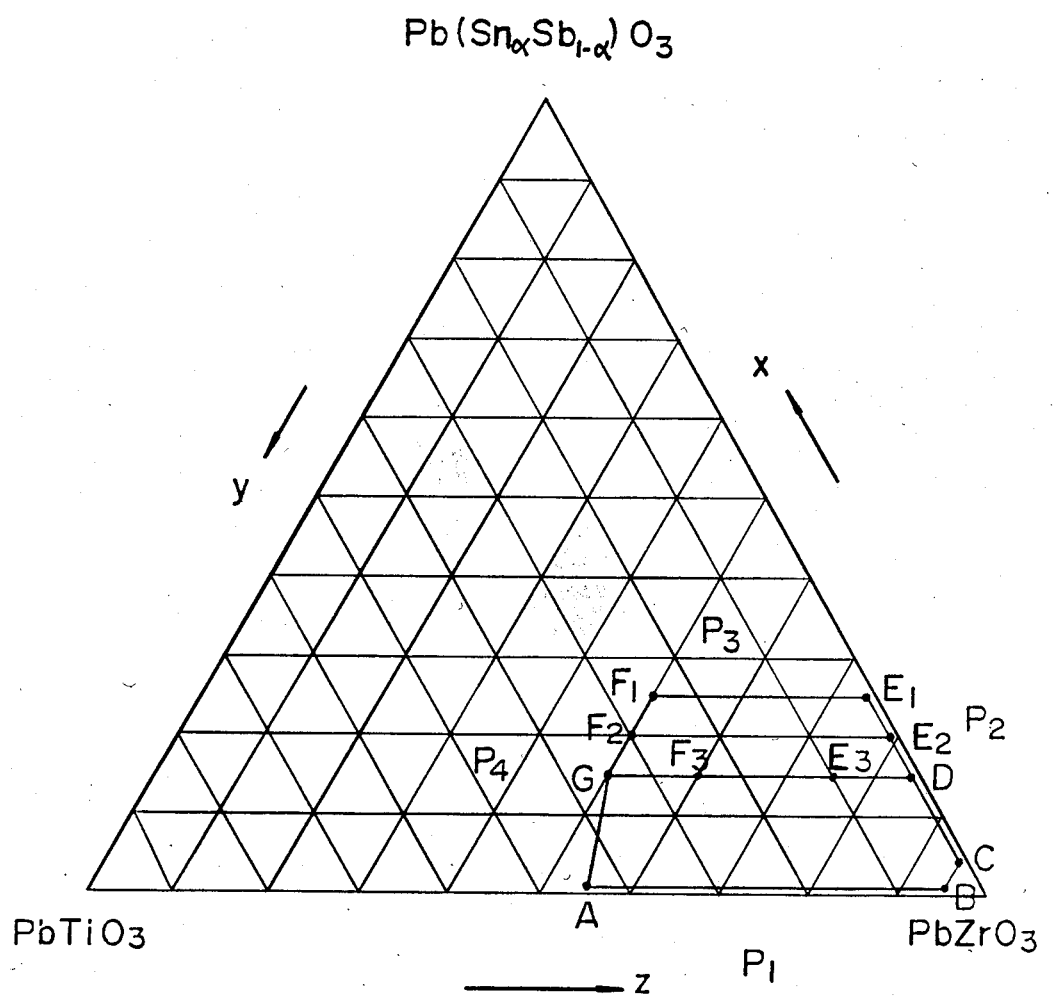
FIG. 4 is a triangular diagram showing the area of the main component of the ceramic compositions according to the present invention.

If the main component of the ceramics has a composition falling in the compositional area $P_1$ or $P_4$ shown in FIG. 4, the propagation loss of acoustic surface waves goes up over 5 dB/cm, resulting in the problem in the practical use. In the compositional area $P_2$, it is difficult to obtain ceramics with piezoelectricity. In the compositional area $P_3$, an amount of x-component of the main component is too large, resulting in the difficulty in the sintering.

An amount of Mn has been described as being in the range from 0.05 to 5.0 wt% with respect to the amount of the main component when converted into $MnO_2$ for the reasons that the addition of $MnO_2$ more than 5.0 wt% or less than 0.05 wt% results in the increase of the propagation loss of surface waves. The addition of Mg enables to minimize the temperature coefficient of center frequency of surface wave filters, but a large amount of Mg more than 5.0 wt% when converted into MgO results in a change for the worse in the temperature coefficient of center frequency and a change for the fragility in the ceramics. Further, the addition of Cr enables to minimize the change rate of $K_{SAW}$ due to the forced heat aging. However, if an amount of Cr is more than 5.0 wt% when converted into $Cr_2O_3$, the change rate of $K_{SAW}$ goes up to over 10% and the resistivity of the ceramics decreases, resulting in the difficulty in the polarization of the ceramics.

The following has become clear after the investigation on the homogeneity of the ceramics. In the ferroelectric rhombohedral compositions, the addition of Mn or the addition of Mn and at least one element selected from the group consisting of Mg and Cr results in ceramics nearly spherical, homogeneous fine grains with a grain size of not more than 5 μm.

In the above respective compositions, up to 20 atomic percent of Pb may be replaced by at least one element selected from the group consisting of Ca, Sr, Cd and Ba, but replacement of Pb more than 20 atomic percent results in the decrease of the piezoelectricity and a lowering of the curie point which causes shift in the inversion temperature to lower temperatures, so that the temperature coefficient of center frequency will not be improved.

What is claimed is:

1. An acoustic surface wave device comprising:
a piezoelectric ceramic wafer consisting essentially of a solid solution of the ternary system $Pb(Sn_{\frac{1}{2}}Sb_{\frac{1}{2}})O_3\text{-}PbTiO_3\text{-}PbZrO_3$ having a composition showing a phase transition between a ferroelectric rhombohedral low temperature phase ($F_{R(LT)}$) and a ferroelectric rhombohedral high temperature phase ($F_{R(HT)}$) at a temperature within the range from $-20°$ C. to $+80°$ C.; and
at least one electromechanical transducing means for converting an electrical signal into acoustic surface waves and vise versa, said transducing means comprising interdigital transducing electrodes coupled to a surface of said piezoelectric ceramic wafer at a transducing region thereof, said composition consisting essentially of a main component expressed by the general formula:

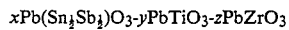

wherein, $x+y+z=1.00$, and an additive consisting of manganese in oxide form in an amount of 0.05 to 5.0 wt% in the form of $MnO_2$, said main component having a composition in the compositional area defined by points A, B, C, D, $E_1$, $F_1$ and G in FIG. 4, the sets of mol fractions of the three components at said points being as follows:

|   | x | y | z |
|---|---|---|---|
| A | 0.01 | 0.44 | 0.55 |
| B | 0.01 | 0.04 | 0.95 |
| C | 0.04 | 0.01 | 0.95 |
| D | 0.15 | 0.01 | 0.84 |
| $E_1$ | 0.25 | 0.01 | 0.74 |
| $F_1$ | 0.25 | 0.25 | 0.50 |
| G | 0.15 | 0.35 | 0.50. |

2. An acoustic surface wave device according to claim 1, wherein said main component has a composition expressed by the formula:

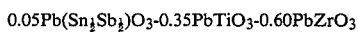

and said additive is contained in an amount of 0.4 wt%.

3. An acoustic surface wave device according to claim 1, wherein said main component has a composition expressed by the formula:

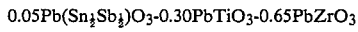

and said additive is contained in an amount of 0.4 wt%.

4. An acoustic surface wave device comprising:
a piezoelectric ceramic wafer consisting essentially of a solid solution of the ternary system $Pb(Sn_{\frac{1}{2}}Sb_{\frac{1}{2}})O_3\text{-}PbTiO_3\text{-}PbZrO_3$ having a composition showing a phase transition between a ferroelectric rhombohedral low temperature phase ($F_{R(LT)}$) and a ferroelectric rhombohedral high temperature phase ($R_{R(HT)}$) at a temperature within the range from $-20°0$ C. to $80°$; and
at least one electrochemical transducing means for converting an electrical signal into acoustic surface waves and vise versa, said transducing means comprising interdigital transducing electrodes coupled to a surface of said piezoelectric ceramic wafer at a transducing region thereof, said composition consisting essentially of a main component expressed by the general formula:

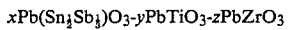

wherein, $x+y=z=1.00$, and additives consisting of manganese in oxide form in an amount of 0.05 to 5.0 wt% in the form of $MnO_2$ and at least one element selected from the group consisting of magnesium and chromium in oxide form in respective amounts of 0.05 to 5.0 wt% in the form of MgO and $Cr_2O_3$, said main component having a composition in the compositional area defined by points A, B, C, D, $E_1$, $F_1$ and G in FIG. 4, the sets of mol fractions of the three components at said points being as follows:

|   | x | y | z |
|---|---|---|---|
| A | 0.01 | 0.44 | 0.55 |
| B | 0.01 | 0.04 | 0.95 |
| C | 0.04 | 0.01 | 0.95 |
| D | 0.15 | 0.01 | 0.84 |
| $E_1$ | 0.25 | 0.01 | 0.74 |
| $F_1$ | 0.25 | 0.25 | 0.50 |

-continued

|   | x | y | z |
|---|---|---|---|
| G | 0.15 | 0.35 | 0.50. |

5. An acoustic surface wave device according to claim 4, wherein said additives are MnO$_2$ and Cr$_2$O$_3$.

6. An acoustic surface wave device according to claim 5, wherein said main component has a composition expressed by the formula:

0.05Pb(Sn$_{\frac{1}{2}}$Sb$_{\frac{1}{2}}$)O$_3$-0.30PbTiO$_3$-0.65PbZrO$_3$ and wherein said additives are 0.4 wt% of MnO$_2$ and 1.0 wt% of CR$_2$O$_3$.

7. An acoustic surface wave device according to claim 4, wherein said main component has a composition expressed by the formula:

0.01Pb(Sn$_{\frac{1}{2}}$Sb$_{\frac{1}{2}}$)O$_3$-0.44PbTiO$_3$-0.55PbZrO$_3$ and wherein said additives are 2.0 wt% of MnO$_2$ and 2.0 wt% of Cr$_2$O$_3$.

8. An acoustic surface wave device according to claim 4, wherein said additives are MnO$_2$ and MgO.

9. An acoustic surface wave device according to claim 8, wherein said main component has a composition expressed by the formula:

0.10Pb(Sn$_{\frac{1}{2}}$Sb$_{\frac{1}{2}}$)O$_3$-0.20PbTiO$_3$-0.70PbZrO$_3$ and wherein said additives are 1.0 wt% of MnO$_2$ and 0.05 wt% of MgO.

10. An acoustic surface wave device according to claim 8, wherein said main component has a composition expressed by the formula:

0.10Pb(Sn$_{\frac{1}{2}}$Sb$_{\frac{1}{2}}$)O$_3$-0.20PbTiO$_3$-0.70PbZrO$_3$ and wherein said additives are 1.0 wt% of MnO$_2$ and 0.1 wt% of MgO.

11. An acoustic surface wave device according to claim 8, wherein said main component has a composition expressed by the formula:

0.20Pb(Sn$_{\frac{1}{2}}$Sb$_{\frac{1}{2}}$)O$_3$-0.01PbTiO$_3$-0.79PbZrO$_3$ and wherein said additives are 3.0 wt% of MnO$_2$ and 0.3 wt% of MgO.

12. An acoustic surface wave device according to claim 4, wherein said additives are MnO$_2$, Cr$_2$O$_3$ and MgO.

13. An acoustic surface wave device comprising:
a piezoelectric ceramic wafer consisting essentially of a solid solution of the ternary system Pb(Sn$_{\frac{1}{2}}$Sb$_{\frac{1}{2}}$)O$_3$-PbTiO$_3$-PbZrO$_3$ having a composition showing a phase transition between a ferroelectric rhombohedral low temperature phase (F$_{R(LT)}$) and a ferroelectric rhombohedral high temperature phase (R$_{R(HT)}$) at a temperature within the range from $-20°$ C. to $+80°$ C.; and
two interdigital transducers for converting an electrical signal into acoustic surface waves and visa versa, formed on a surface of said piezoelectric ceramic wafer at a transducing region thereof,
said composition consisting essentially of a main component expressed by the general formula:

$x$Pb(Sn$_{\frac{1}{2}}$Sb$_{\frac{1}{2}}$)O$_3$-$y$PbTiO$_3$-$z$PbZrO$_3$ wherein, $x+y+z=1.00$, and an additive consisting of manganese in oxide form in an amount of 0.05 to 5.0 wt% in the form of MnO$_2$, said main component having a composition in the compositional area defined by points A, B, C, D, E$_1$, F$_1$ and G in FIG. 4, the sets of mol fractions of the three components at said points being as follows:

|   | x | y | z |
|---|---|---|---|
| A | 0.01 | 0.44 | 0.55 |
| B | 0.01 | 0.04 | 0.95 |
| C | 0.04 | 0.01 | 0.95 |
| D | 0.15 | 0.01 | 0.84 |
| E$_1$ | 0.25 | 0.01 | 0.74 |
| F$_1$ | 0.25 | 0.25 | 0.50 |
| G | 0.15 | 0.35 | 0.50. |

14. An acoustic surface wave device comprising:
a piezoelectric ceramic wafer consisting essentially of a solid solution of the ternary system Pb(Sn$_{\frac{1}{2}}$Sb$_{\frac{1}{2}}$)O$_3$-PbTiO$_3$-PbZrO$_3$ having a composition showing a phase transition between a ferroelectric rhombohedral low temperature phase (F$_{R(LT)}$) and a ferroelectric rhombohedral high temperature phase (F$_{R(HT)}$) at a temperature within the range from $-20°$ C. to $+80°$ C.; and
two interdigital transducers for converting an electrical signal into acoustic surface waves and vise versa, formed on a surface of said piezoelectric ceramic wafer at a transducing region thereof,
said composition consisting essentially of a main component expressed by the general formula:

$x$Pb(Sn$_{\frac{1}{2}}$Sb$_{\frac{1}{2}}$)O$_3$-$y$PbTiO$_3$-$z$PbZrO$_3$ wherein, $x+y+z=1.00$, and additives consisting of manganese in oxide form in an amount of 0.05 to 5.0 wt% in the form of MnO$_2$ and at least one element selected from the group consisting of magnesium and chromium in oxide form in respective amounts of 0.05 to 5.0 wt % in the form of MgO and Cr$_2$O$_3$, said main component having a composition in the compositional area defined by points A, B, C, D, E$_1$, F$_1$ and G in FIG. 4, the sets of mol fractions of the three components at said points being as follows:

|   | x | y | z |
|---|---|---|---|
| A | 0.01 | 0.44 | 0.55 |
| B | 0.01 | 0.04 | 0.95 |
| C | 0.04 | 0.01 | 0.95 |
| D | 0.15 | 0.01 | 0.84 |
| E$_1$ | 0.25 | 0.01 | 0.74 |
| F$_1$ | 0.25 | 0.25 | 0.50 |
| G | 0.15 | 0.35 | 0.50. |

* * * * *

UNITED STATES PATENT AND TRADEMARK OFFICE
CERTIFICATE OF CORRECTION

PATENT NO. : 4,568,848
DATED : February 4, 1986
INVENTOR(S) : Toshio OGAWA

It is certified that error appears in the above-identified patent and that said Letters Patent is hereby corrected as shown below:

IN THE HEADING OF THE PATENT:

In Section [30], change:
"Nov. 25, 1974 [JP] Japan ...............49-141477" to
--Nov. 25, 1975 [JP] Japan ...............49-141477--.

Signed and Sealed this

Nineteenth Day of August 1986

[SEAL]

Attest:

DONALD J. QUIGG

Attesting Officer

Commissioner of Patents and Trademarks